(12) United States Patent
Tsai

(10) Patent No.: US 6,188,295 B1
(45) Date of Patent: Feb. 13, 2001

(54) FREQUENCY ADJUSTMENTS BY PATTERNING MICRO-STRIPS TO FORM SERIALLY CONNECTED CAPACITORS OR INDUCTOR-CAPACITOR (LC) CIRCUIT

(75) Inventor: Yu-Yuan Tsai, Taoyuan (TW)

(73) Assignee: Delta Electronics, Inc., Taipei (TW)

( * ) Notice: Under 35 U.S.C. 154(b), the term of this patent shall be extended for 10 days.

(21) Appl. No.: 09/291,436

(22) Filed: Apr. 13, 1999

(51) Int. Cl.[7] ........................................................ H03B 5/18
(52) U.S. Cl. .................... 331/108 D; 331/96; 331/117 D; 331/177 V; 331/179
(58) Field of Search .................................. 331/68, 96, 99, 331/100, 117 D, 108 D, 107 SL, 175, 179, 177 V

(56) References Cited

U.S. PATENT DOCUMENTS

| 4,758,922 | * | 7/1988 | Ishigaki et al. | 361/330 |
| 5,227,739 | * | 7/1993 | Mandai et al. | 331/96 |
| 5,852,388 | * | 12/1998 | Nakai et al. | 331/177 V |

* cited by examiner

Primary Examiner—David Mis
(74) Attorney, Agent, or Firm—Bo-In Lin

(57) ABSTRACT

The present invention discloses an electronic device formed by interconnecting a plurality of circuit elements. The electronic device includes a first patterned conductive layer constituting micro-strips for interconnecting the plurality of circuit elements. And, one of the micro-strips constituting an open-transmission line having a first end connected to a capacitor and a second end as an open-end, wherein the open transmission line is cut into separate segments for adjusting capacitance of the electronic device. In another preferred embodiment, this invention discloses an electronic device formed by interconnecting a plurality of circuit elements. The electronic device includes a first patterned conductive layer constituting micro-strips for interconnecting the plurality of circuit elements. And, one of the micro-strips constituting a capacitor-connection line for interconnecting two capacitors wherein the capacitor connection line is cut partially for providing a serially connected inductance coupling to the capacitors.

27 Claims, 16 Drawing Sheets

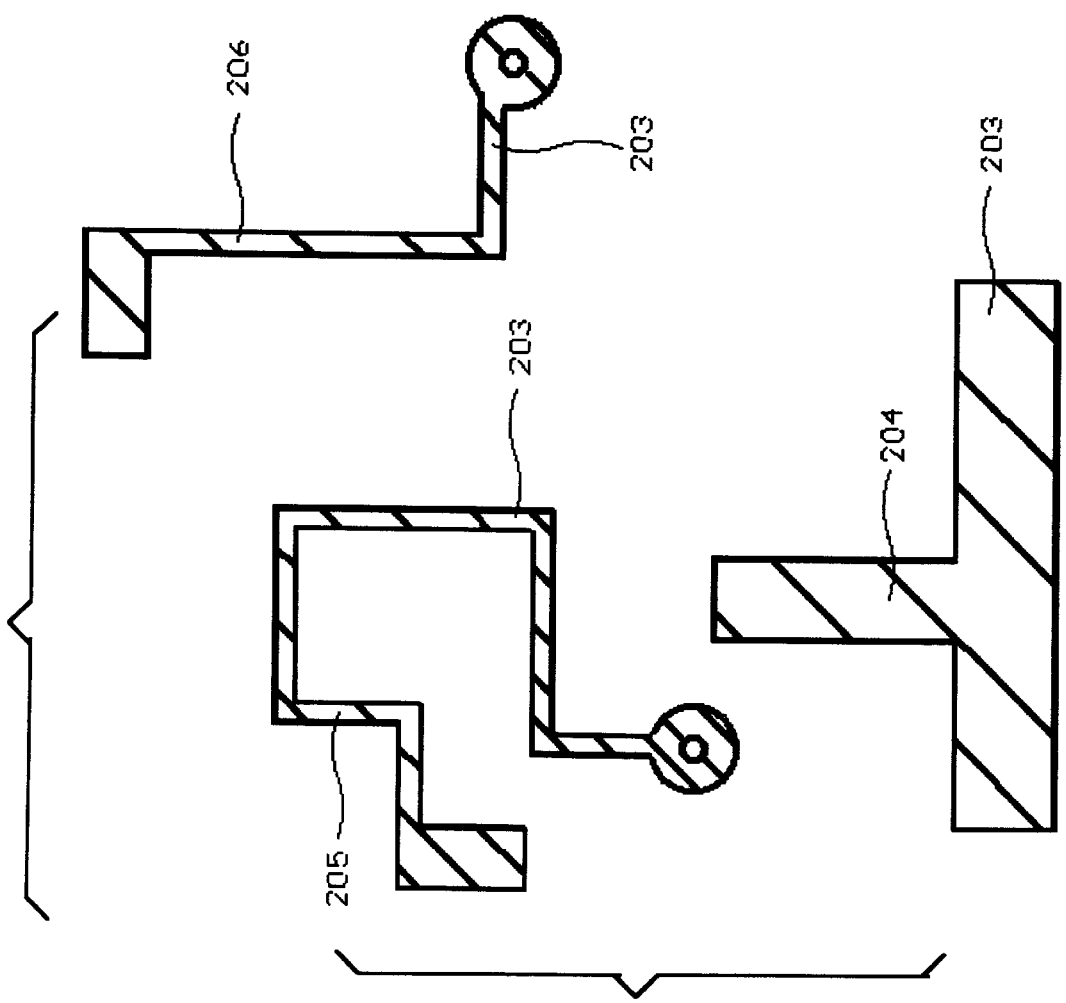

FREQUENCY ADJUSTMENTS BY PATTERNING MICRO-STRIPS TO FORM SERIALLY CONNECTED CAPACITORS OR INDUCTOR-CAPACITOR (LC) CIRCUIT

BACKGROUND OF THE INVENTION

1. Field of the Invention

This invention relates generally to the configuration and method of manufacturing an electronic device. More particularly, this invention relates to a new configuration and method of manufacturing a miniaturized voltage control oscillator by multiple-layered micro-strips wherein simple manufacture steps can be employed to increase or decrease the frequency without impacting other electrical performance characteristics.

2. Description of the Prior Art

Once an electronic device is manufactured with all the circuit elements connected according to certain design with specific predefined configuration, there is generally very little flexibility to change the performance characteristics by changing the interconnected circuit elements. Difficulties often arise when fine-tuning of the performance characteristics is still necessary to satisfy the design specification. The results of the performance tests conducted on the "finished product" of the device may not entirely conform to the requirements demanded by the specification. Furthermore, performance characteristics are often altered as the results of variations of size, dimensions, statistical variations of functional parameters of the circuit elements or due to changes of the conditions of the manufacture processes. The demand for fining tuning and adjustment is necessary to overcome these uncertainty and unpredictability in the manufacture processes. One specific adjustment is related to the fine-tuning of the frequency of a voltage-controlled oscillator (VCO). Simple and convenient methods without significant alternation to the configuration of the oscillator is required to provide voltage control oscillator (VCO) at reasonably low production cost while maintaining high degree of reliability for a voltage controlled oscillator (VCO) manufactured with improved miniaturized configurations.

In a co-pending patent application filed by the Applicants of this invention, an improved circuit configuration is disclosed to miniaturize a voltage-controlled oscillator. In order to reduce the size of an oscillator an improved inductor must be provided. An inductor incorporated in an oscillator by applying a surface mounted device (SMD) technology provides the advantage of size-reduction. However, the manufacture process implemented with a SMD technology is more expensive and causes the production of the oscillator to increase. Therefore, a new configuration with multiple layers of conductive micro-strips is disclosed in the co-pending Application to provide an inductor employed in the VCO. Thus, the new VCO significantly reduces the size, the thickness and the weight of the electronic device. Meanwhile, an oscillator produced with simplified manufacturing processes with high reliability at low cost is disclosed in the co-pending application Ser. No. 09/089,269 filed on Jun. 2, 1998. However, after completion of the manufacturing processes, a fine tuning to adjust the oscillator's frequency is still required due to variations of circuit parameters as discussed above.

Therefore, an improved device configuration and manufacturing process is still required to simplify the process of fine-tuning for frequency adjustment operations. This simplified frequency adjustment process must be provided without significantly change the configuration of the circuit connections of the oscillator. It is further desirable that the simplified frequency adjustment processes can be carried out without requiring expensive equipment or complicated test procedures such that the production processes can be conveniently carried out using significantly less time to further reduce the production cost of the assembled systems.

SUMMARY OF THE PRESENT INVENTION

It is therefore an object of the present invention to provide a novel frequency tuning configuration for manufacturing a voltage control oscillator with reduced size and simplified manufacturing such that the aforementioned limitations and difficulties encountered in the prior art can be overcome.

Specifically, it is an object of the present invention to provide a novel configuration for manufacturing and assembling an electronic device by overlapping multiple layers of conductive foils with insulation layer provided with through holes filled with conductive materials to interconnect circuits distributed over several layers. The frequency fining tuning is achieved by cutting open conductive segments to function as capacitors or by partially cutting a conductive strips to function as inductors thus decreasing or increasing the frequency.

Another object of the present invention is to provide a novel configuration and assembling process for interconnecting circuit elements disposed in a multi-layer assembly connected with patterned conductive foils as micro-strips. The size, height and weight of the electronic assembly are reduced and cost savings are achieved with simplified manufacturing processes.

Another object of the present invention is to provide a novel configuration and assembling process for interconnecting circuit elements disposed in a multi-layer assembly connected with patterned conductive foils as micro-strips. The processes for fine tuning the performance characteristics are simplified by making minor variation to the size and shapes of the micro strips. The variations may include cutting transmission lines into separate segments to decrease the capacitance of cutting partially into the transmission lines to increase the inductance.

According to the present invention, a compact oscillator device is disclosed that includes at least an inductor, a resistor, a transistor and a capacitor interconnected for providing an oscillation function. The oscillator device is formed with a first conductive layer patterned as transmission strips to interconnect the circuit elements of capacitor, resistor and transistor. The oscillator device then includes a second conductive layer patterned as inductive circuit The oscillator device further includes a first ground layer for electrically connecting to the first and the second conductive layers for providing a ground voltage. There are insulation layers placed between the conductive layers and the ground layers. The insulation layers are formed with through holes filled with conductive fillers to serve as via-connection between circuit elements provided on several layers. The insulation layers may be formed with FR4 insulating material.

Briefly, in a preferred embodiment, the present invention discloses an electronic device formed by interconnecting a plurality of circuit elements. The electronic device includes a first patterned conductive layer constituting micro-strips for interconnecting the plurality of circuit elements. And, one of the micro-strips constituting an open-transmission line having a first end connected to a capacitor and a second end as an open-end, wherein the open transmission line is cut into separate segments for adjusting capacitance of the electronic device.

In another preferred embodiment, this invention discloses an electronic device formed by interconnecting a plurality of circuit elements. The electronic device includes a first patterned conductive layer constituting micro-strips for interconnecting the plurality of circuit elements. And, one of the micro-strips constituting a capacitor-connection line for interconnecting two capacitors wherein the capacitor connection line is cut partially for providing a serially connected inductance coupling to the capacitors.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIGS. 4A to 4F are conductive foils and cross sectional views similar to that shown in FIGS. 2A to 2F for configuring and assembling an oscillator device of FIG. 3;

DETAILED DESCRIPTION OF THE PREFERRED EMBODIMENT

Figure 1:
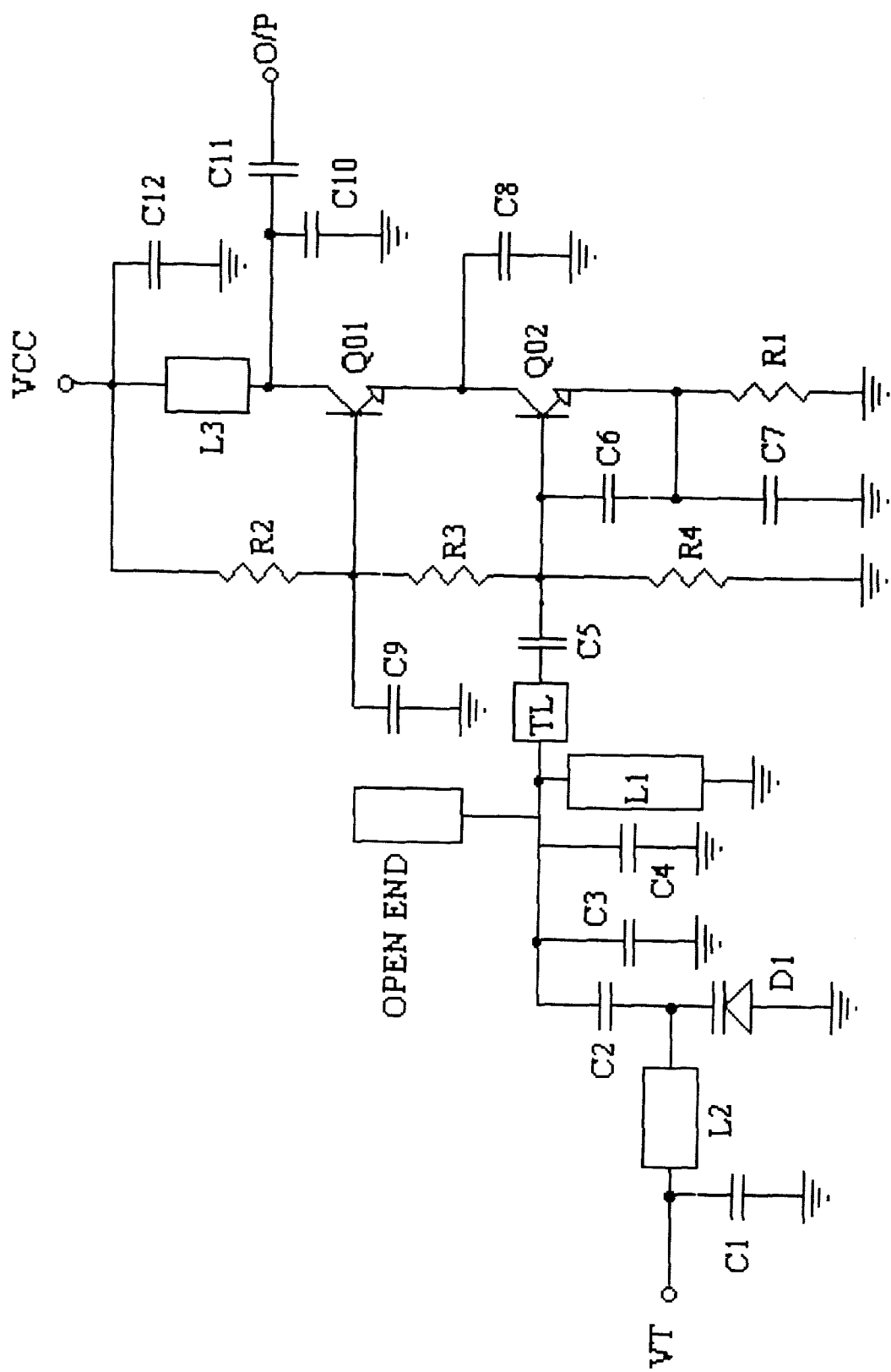
FIG. 1 is a schematic circuit diagram showing an oscillator device of the present invention.

Referring to FIG. 1 for a schematic circuit diagram for an oscillator of the present invention. The voltage-controlled oscillator as that shown in FIG. 1 includes circuit elements of resistors, capacitors, transistors and inductors. Novelty of this invention is further explained according to the interconnection of these circuit elements by the use of multiple layers of patterned conductive foils and micro-strips. Unlike the conventional circuits where the circuit elements such as resistor, capacitors, inductors, and transistors are interconnected with conductive lines, multiple conductive layers of patterned foils and micro-strips provide the circuit interconnections.

Figure 2A:
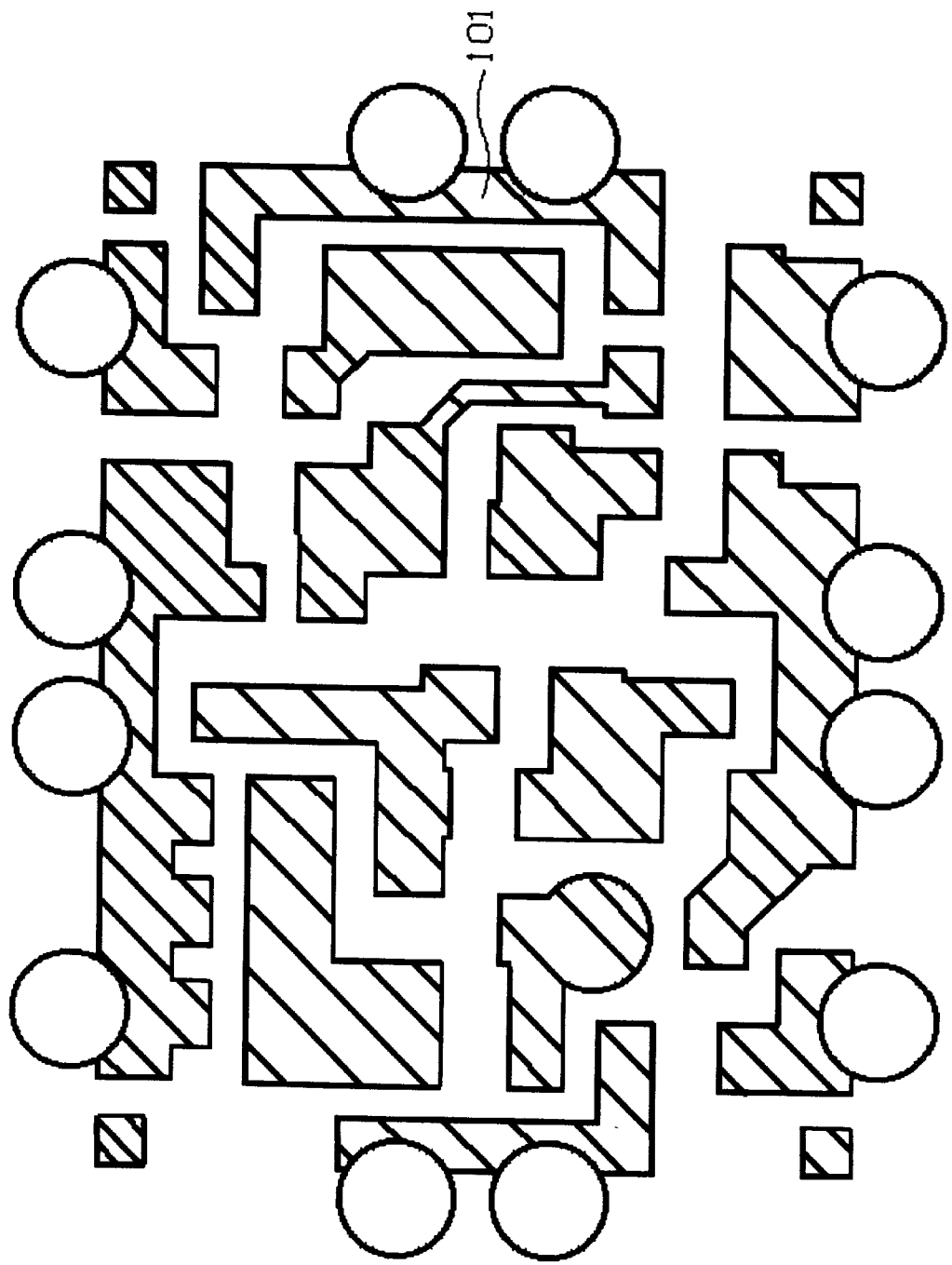
FIG. 2A shows a first layer of patterned conductive foil serving the function of conductive strips for interconnecting circuit elements of capacitors, transistors and resistors according circuit diagram of FIG. 1.
Figure 2B:
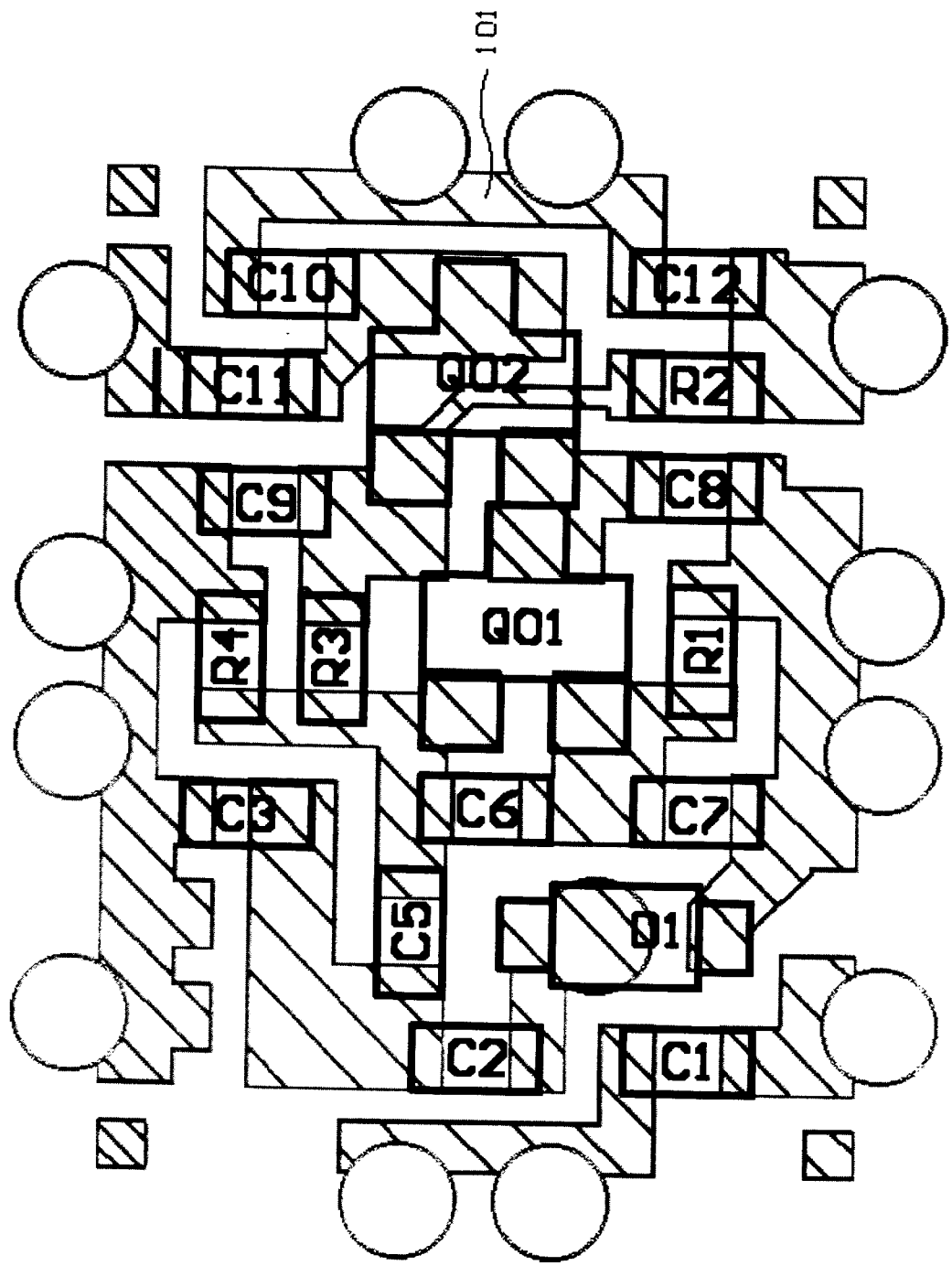
FIG. 2B is a diagram for showing circuit elements interconnected by employing the patterned conductive foils of FIG. 2A.
Figure 2C:
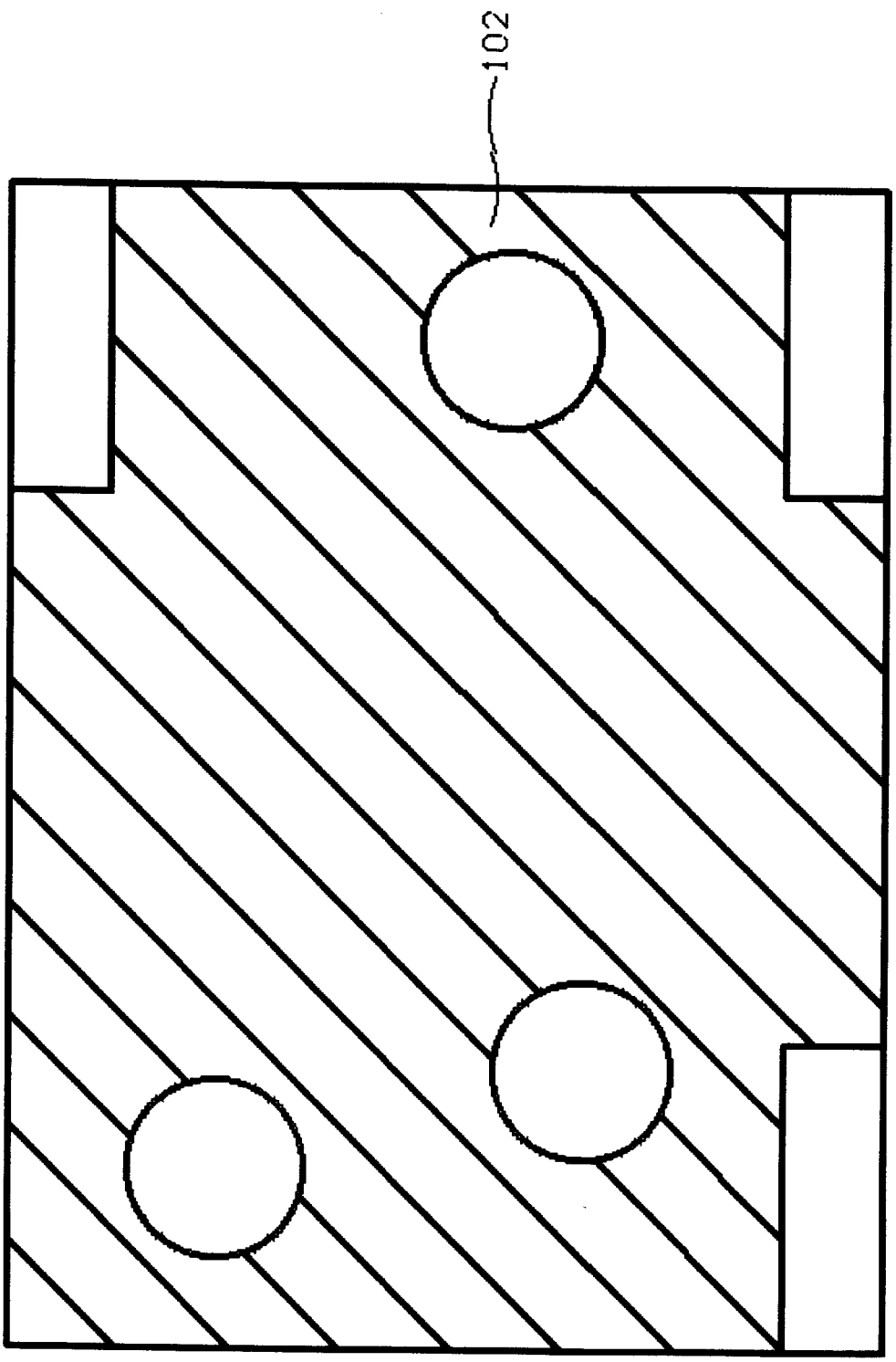
FIG. 2C shows a patterned conductive layer serving as a first ground layer for the oscillator of FIG. 1.
Figure 2D:
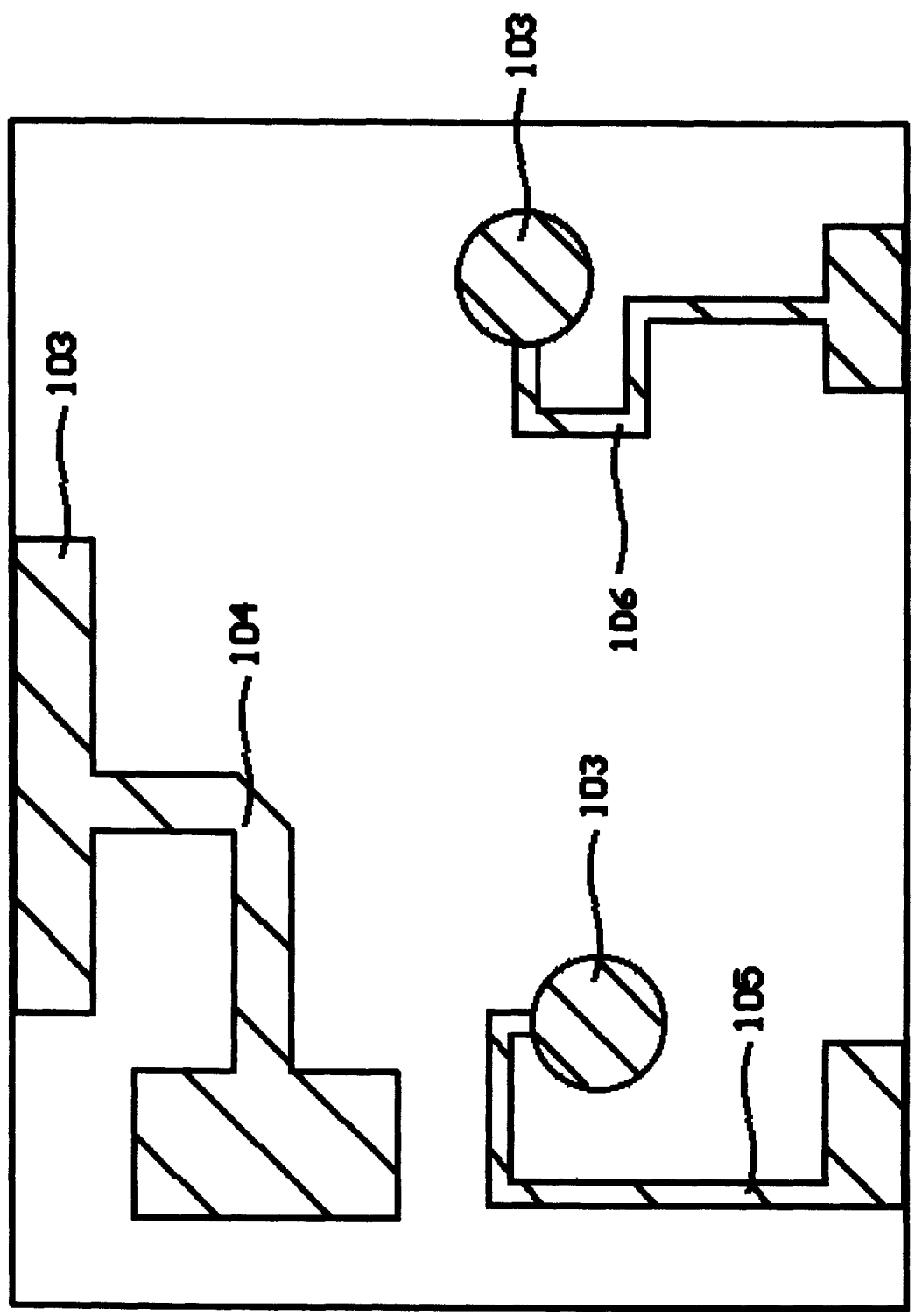
FIG. 2D shows a patterned conductive foil for providing inductive circuits for the oscillator of FIG. 1.
Figure 2E:
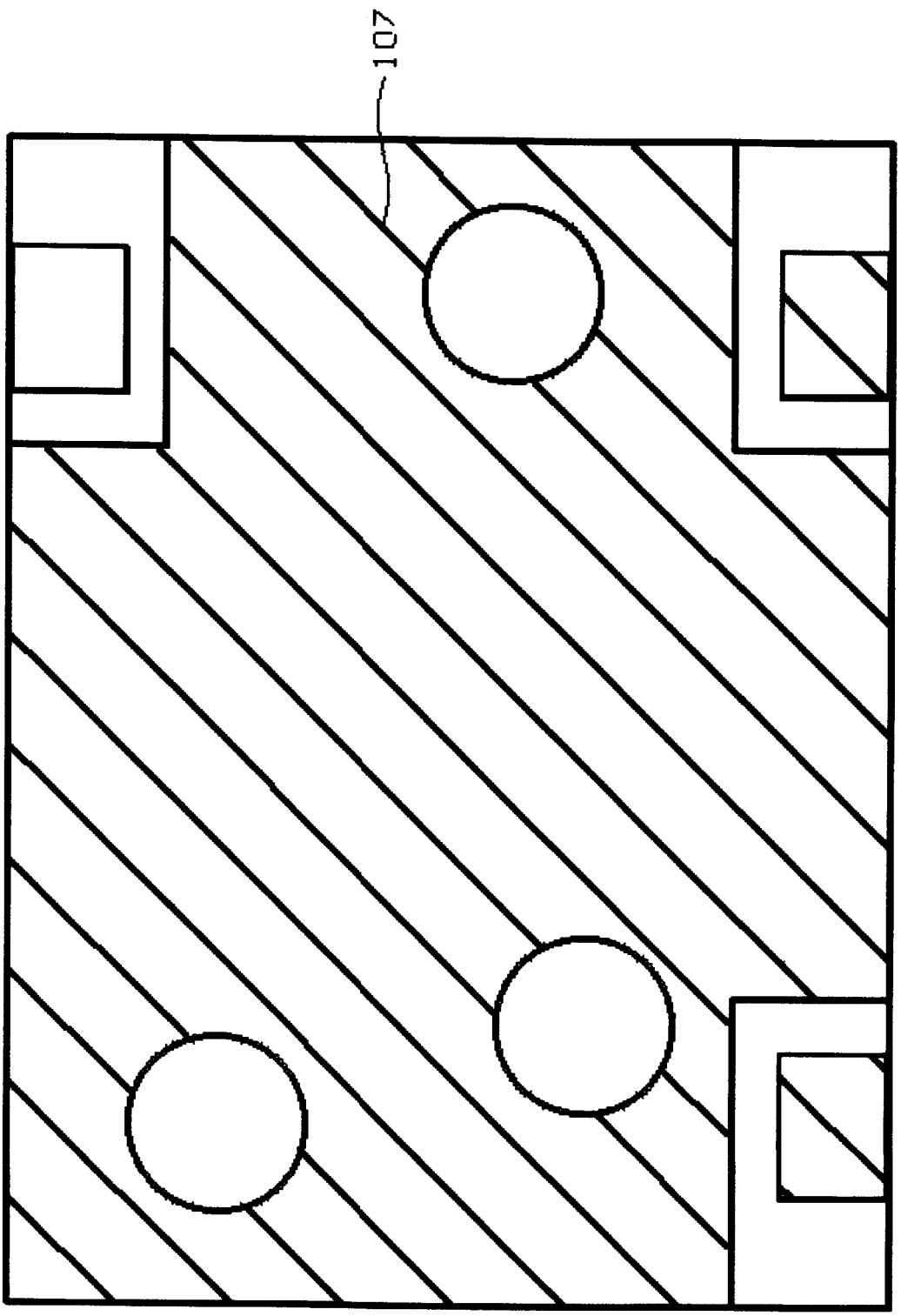
FIG. 2E shows a patterned conductive foil serving as a second ground layer of the oscillator of FIG. 1.

Referring to FIG. 2A for a first layer 101 of patterned copper foil for providing a interconnecting layer between the circuit elements shown in FIG. 1. Specifically, the relative locations of different circuit elements, e.g., the resistors, the capacitors, the transistors and the inductors as that shown in FIG. 1 are shown in FIG. 2B. Referring to FIG. 2C for a patterned copper foil 102 as a first ground potential layer for the oscillator of this invention. Referring to FIG. 2D for a patterned copper foil 103 as a second transmission layer. The patterned copper foil 104 constitutes inductor L1, the patterned foil 105 constitutes the inductor L2, and the patterned foil 106 constitutes the inductor L3 and the equivalent circuit connections for the inductors L1, L2 and L3 are shown in FIG. 1. Referring to FIG. 2E for a patterned copper foil 107 as a second ground layer of the oscillator of this invention.

Figure 2F:
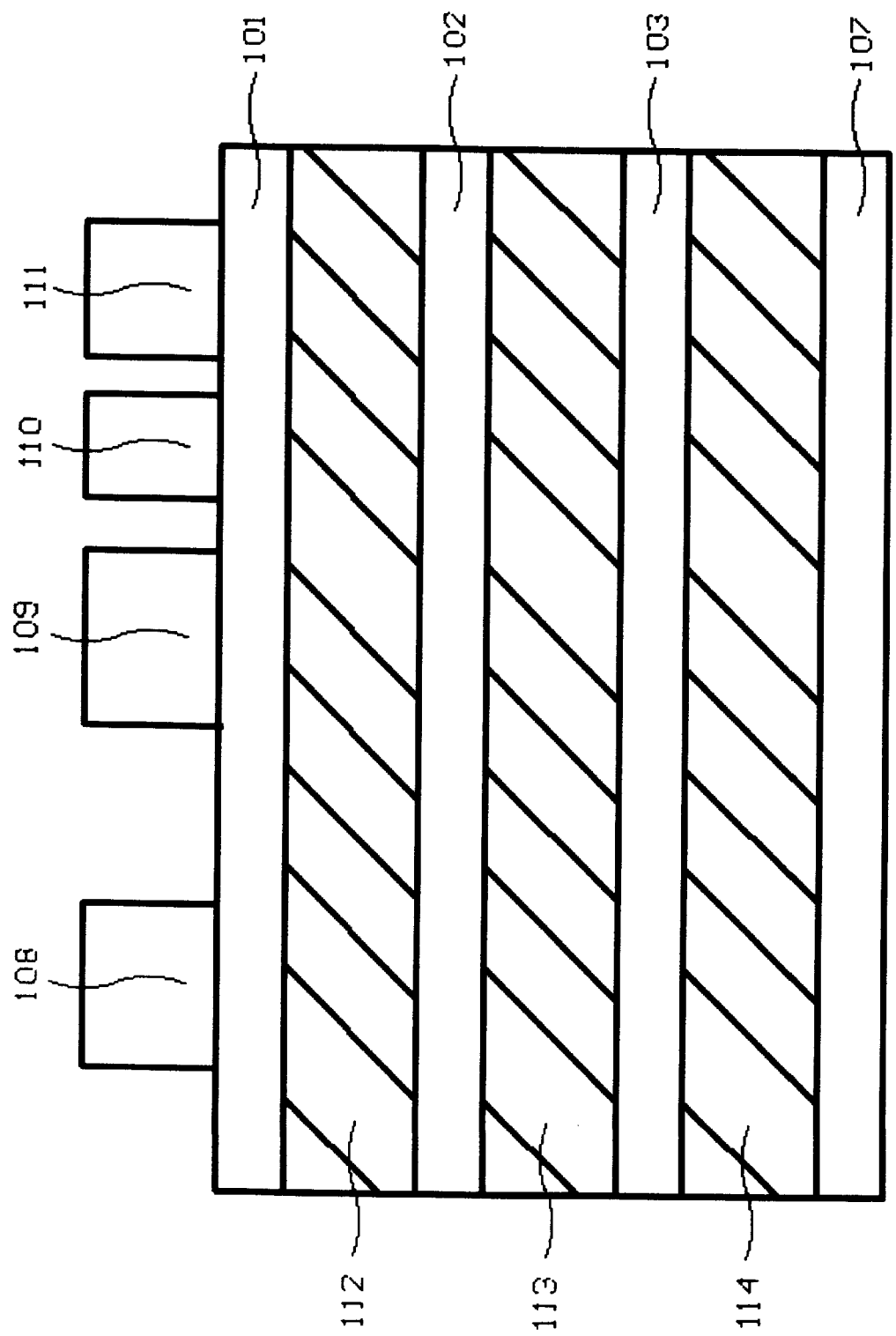
FIG. 2F shows a cross sectional view of the oscillator formed by assembling these multiple layers of patterned copper layers shown in FIGS. 2A to 2E.

FIG. 2F shows a cross sectional view of the oscillator formed by assembling these multiple layers of patterned copper layers 101 to 107 by placing an insulation layers 112, 113, and 114 between these layers. The insulation layers 112, 113, and 114 may be insulation layers composed of glassy fiber FR4. Welding a resistor 108, a transistor 109, a capacitor 110, and a diode 111 to the locations of these circuit elements shown in FIG. 1 to the first layer of copper foils 101 completes the process of fabrication for the oscillator. The first transmission layer 101 as that shown in FIG. 2A includes a plurality of conductive micro-strips while the second transmission layer 103 with the micro-strips provide the circuit elements of three conductors L1, L2, and L3. The first and the second ground layers 102 and 107 are connected to the transmission layers 101 and 103 by via-hole connections. Penetrating via holes through the insulation layers 112, 113 and 114 and then filling these via-holes with conductive materials forms these via-hole connection means.

According to this invention, the inductors can be formed with patterned conductive foils, e.g., copper foils, with an etch process to pattern the foils as strip lines. An oscillator with reduced size and weight and thickness is disclosed. The oscillator can also be manufactured at a lower production cost than that of an oscillator manufactured by applying the surface mounted device (SMD) technology because a simplified process suitable for mass production is provided.

Figure 3:
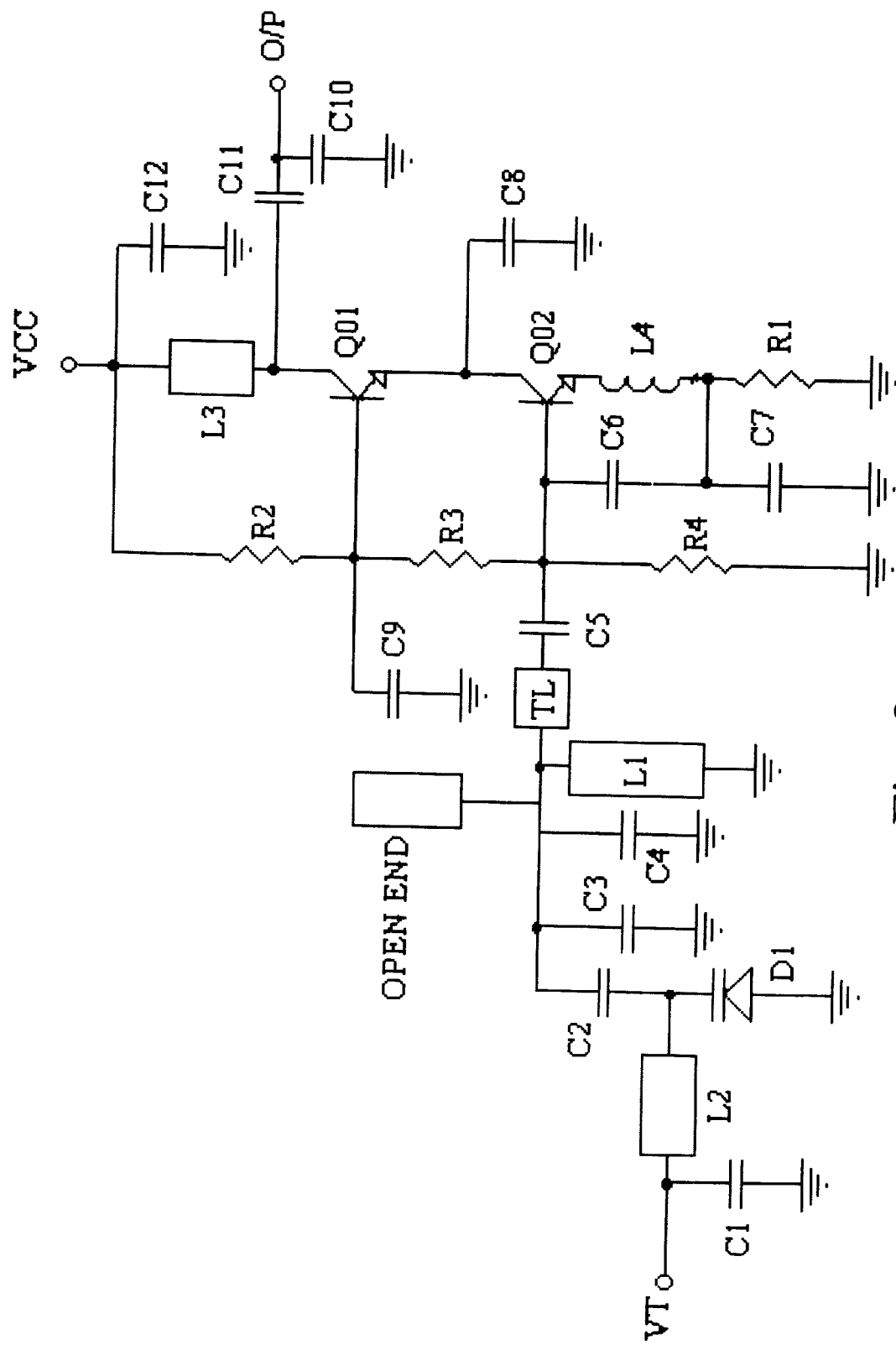
FIG. 3 is a schematic circuit diagram showing another oscillator device of the present invention.
Figure 4A:
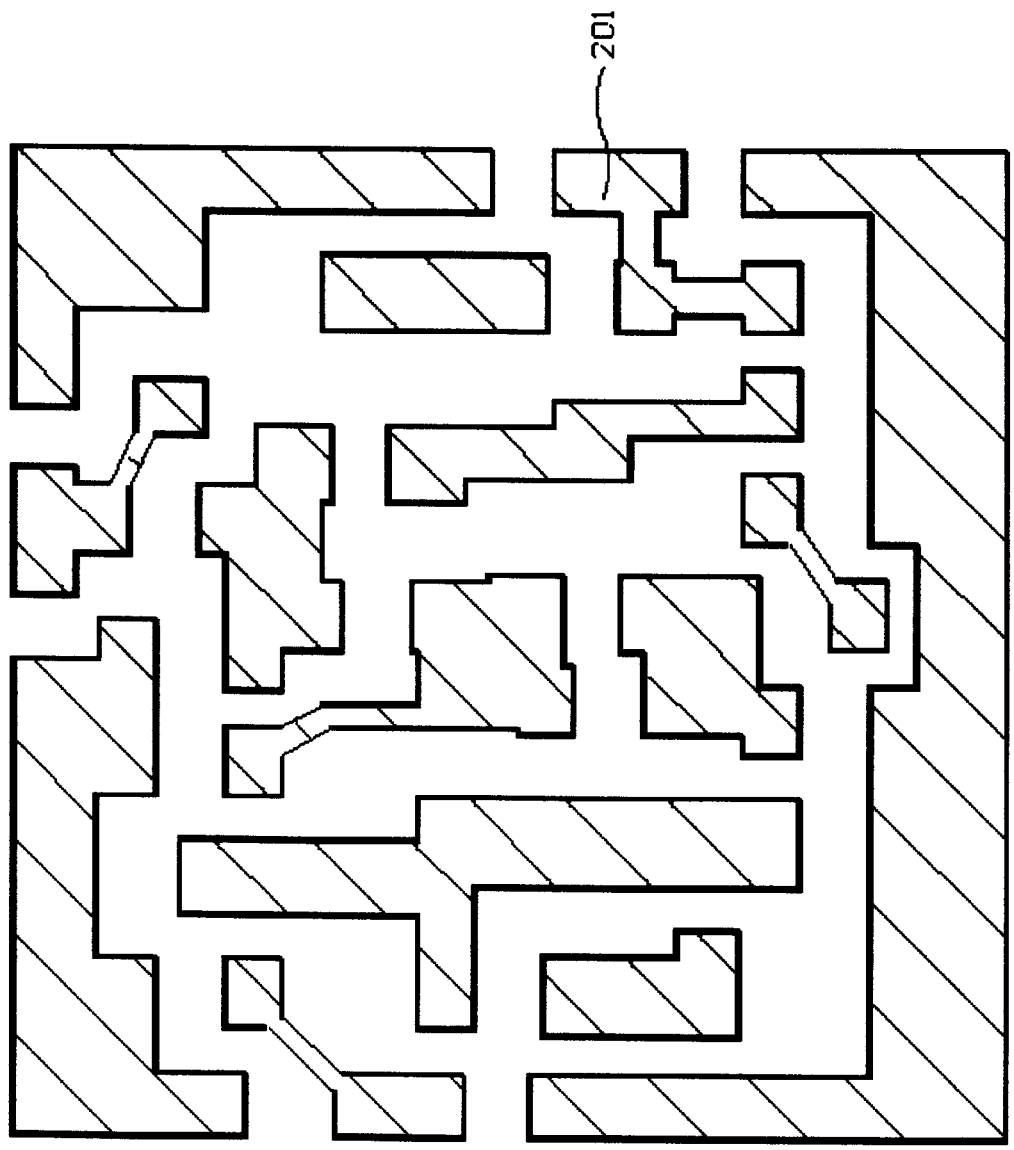
Figure 4B:
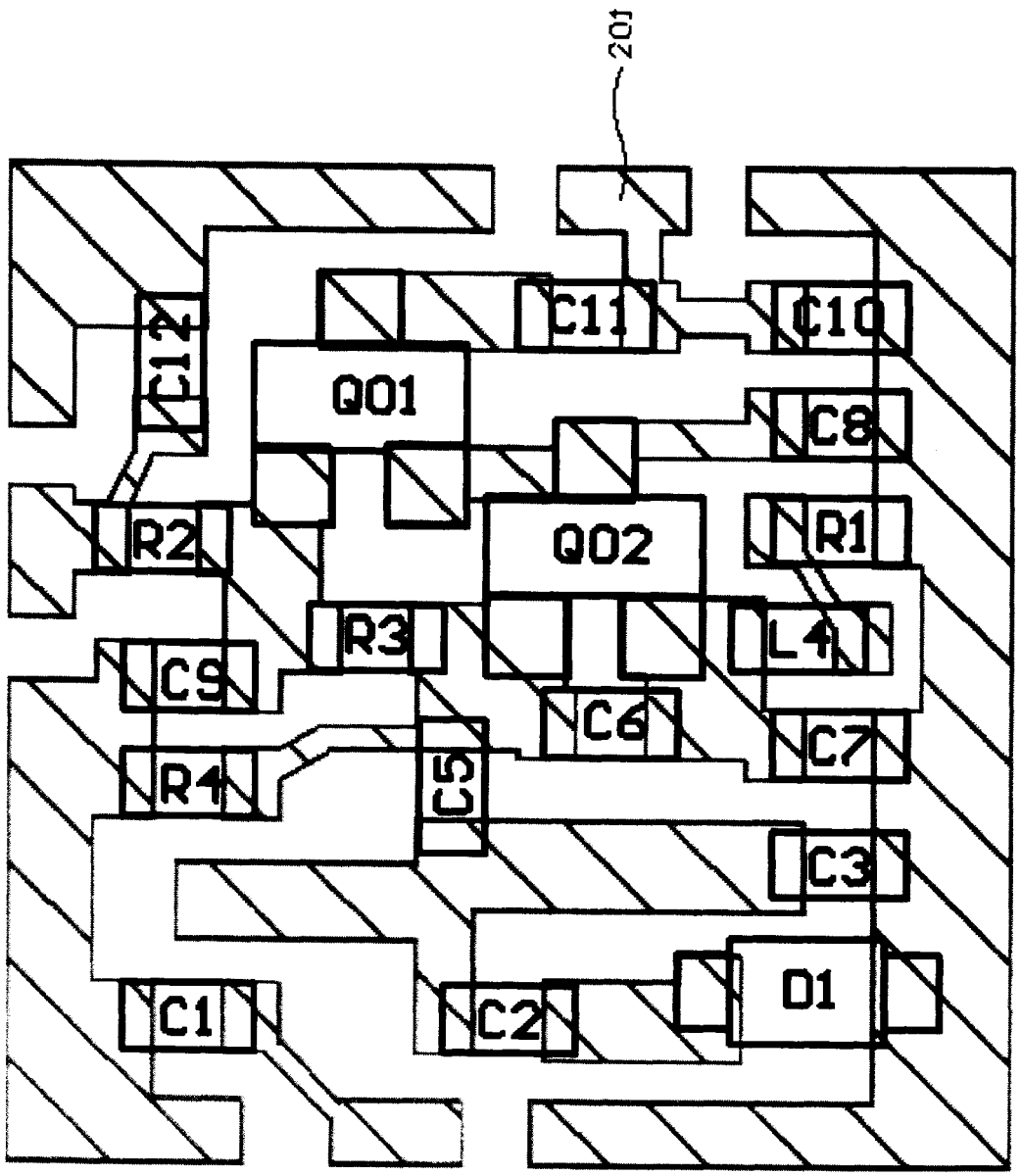
Figure 4C:
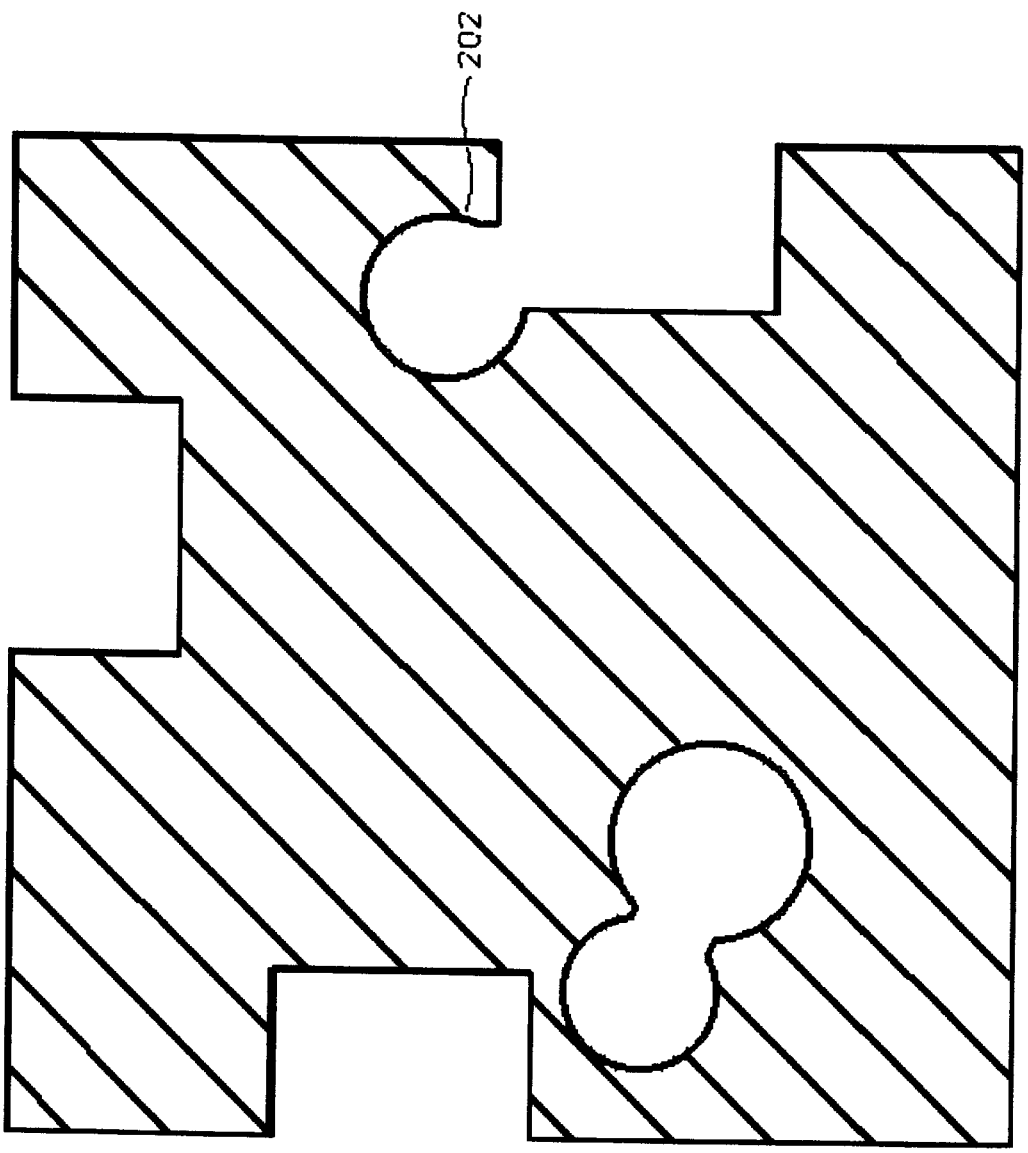
Figure 4E:
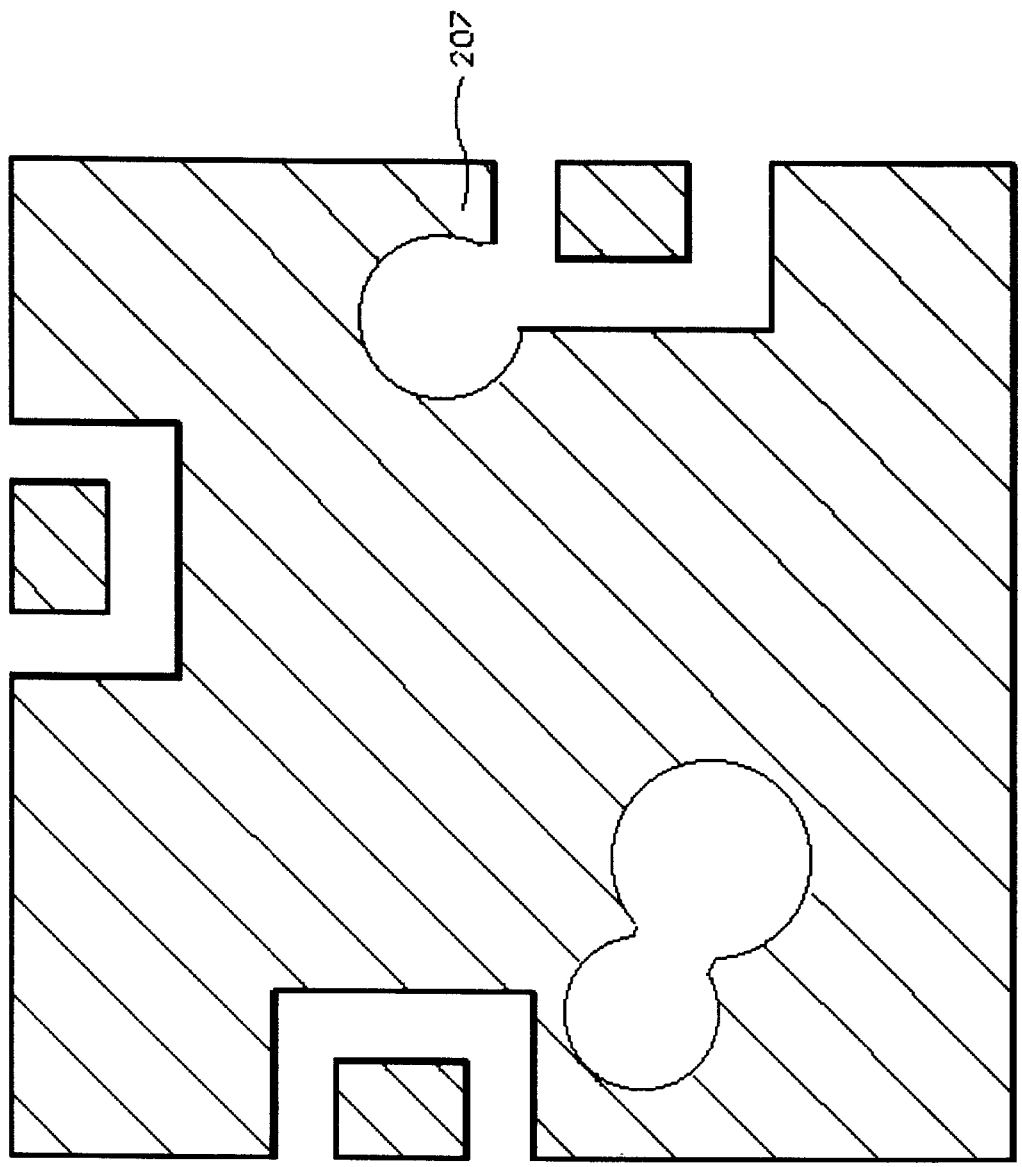
Figure 4F:
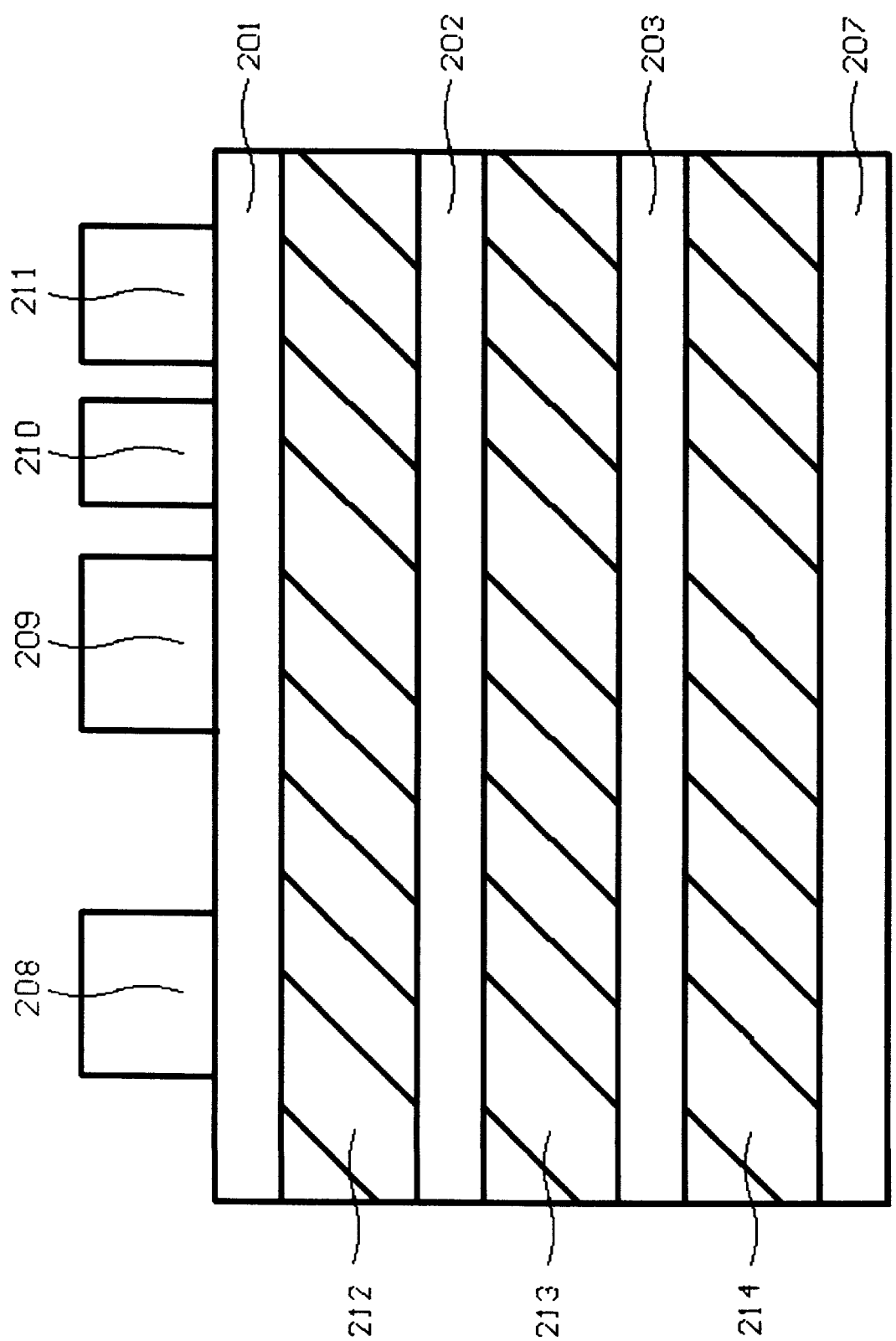

Referring to FIG. 3 for a circuit diagram of another oscillator of the present invention. The oscillator of FIG. 3 is manufactured by using transmission layers and ground layers as that shown in FIGS. 4A to 4D. Referring to FIG. 4A for a first transmission layer 201 with relative locations of circuit elements of FIG. 4B also shown for interconnections by making use of the micro-strip lines. FIG. 4C is a patterned copper foil 202 implemented as a first ground layer of the oscillator of FIG. 3. FIG. 4D is a patterned copper foil as a second transmission layer 203 formed as micro-strips to provide the circuit function as inductors. FIG. 4E is another patterned copper foil implemented as a second ground layer 207. These four layers are assembled as an oscillator similar to that shown in FIG. 4F.

For the purpose of adjusting the frequency of this oscillator, the micro-strips as transmission lines in the first transmission layer 201 can be flexibly changed with slightly different patterns thus fine-tuning the circuit frequency. For example, referring to FIG. 5, the transmission line A is cut along line-a such that transmission line A becomes two separate segments. When the transmission line A is cut into two segments, a new capacitor is formed at the connection point of C5 and transmission line A. The capacitance of the oscillator is reduced because a capacitor with capacitance C(A) is formed when the transmission line A is cut into two separate segments and this new capacitor is serially connected to C5. The new capacitance C' becomes:

$$C' = C5 + C(A) < C5 + C(A) \text{original}$$

The length of the open-ended transmission line A should be less than λ/4, where λ is the wavelength.

Since the frequency of the oscillator is reversely proportional to LC of the circuit where L is the inductance and C is the capacitance, as the capacitance C is reduced, a higher frequency is obtained. Therefore, by cutting the transmission line A into two separate segment, the frequency of the oscillator is increased. In one exemplary circuit of frequency 2.0 GHz, the frequency is increased for about 60 MHz by cutting the transmission line A into two separate segments.

Figure 5:
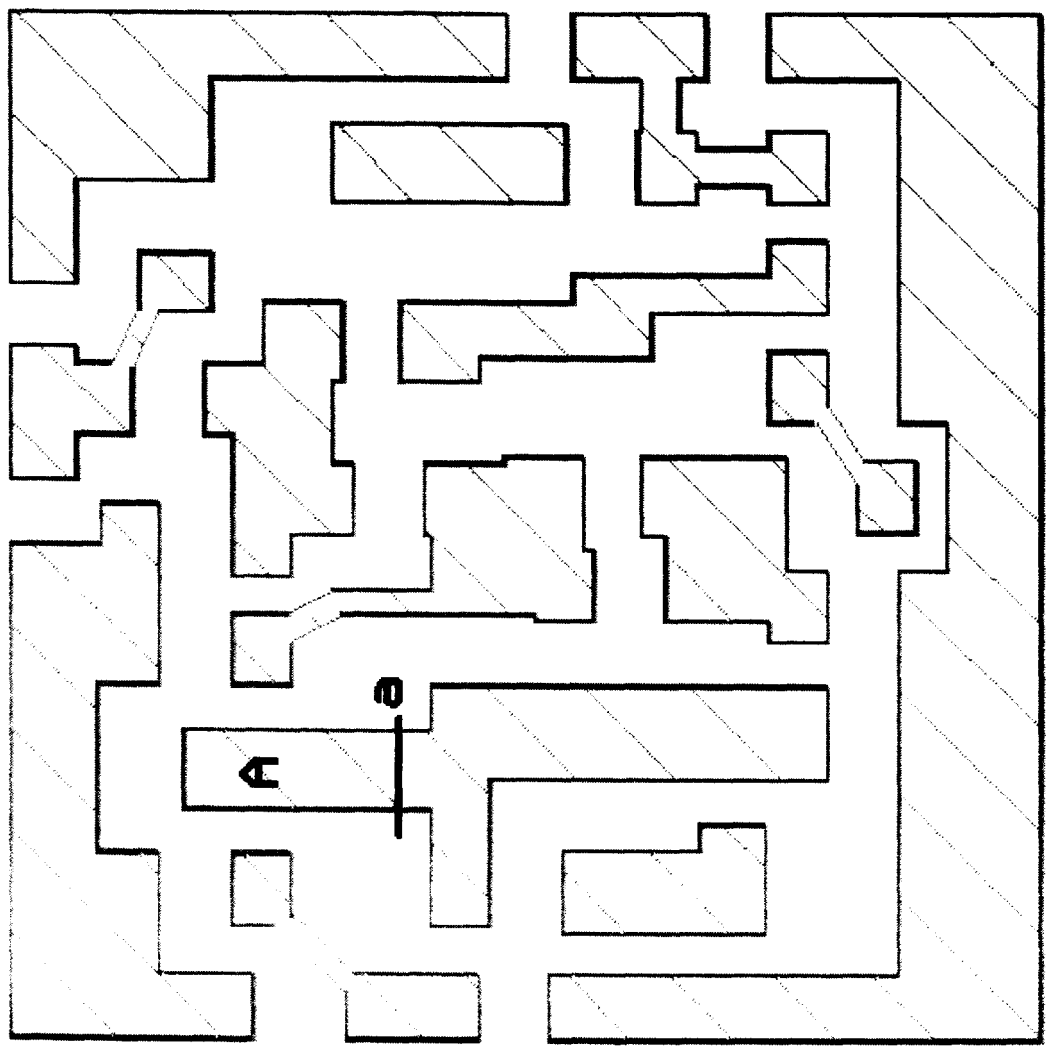
FIG. 5 is a variation to the patterned conductive foil of FIG. 4A for increasing the frequency of the oscillator of FIG. 3.

According to FIG. 5 and above description, the present invention discloses an electronic device formed by interconnecting a plurality of circuit elements. The electronic device includes a first patterned conductive layer 201 constituting micro-strips for interconnecting the plurality of circuit elements. And, one of the micro-strips, e.g., the transmission line A, constituting an open-transmission line having a first end connected to a capacitor C5, and a second end as an open-end, wherein the open transmission line A is cut into separate segments for adjusting capacitance of the electronic device.

Figure 6:
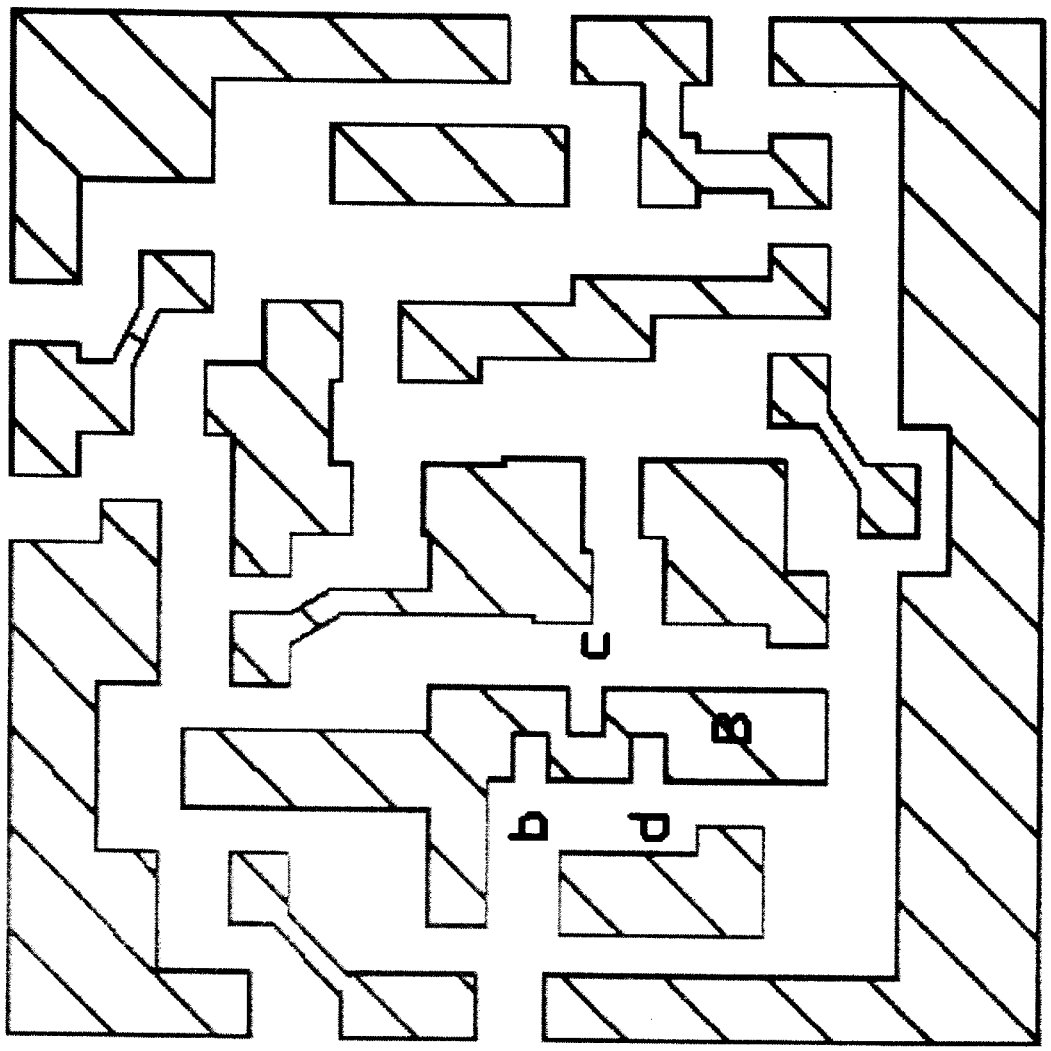
FIG. 6 is a variation to the patterned conductive foil of FIG. 4A for decreasing the frequency of the oscillator of FIG. 3.

In another preferred embodiment as that shown in FIG. 6, instead of cutting the transmission line A into two separate segments, the transmission line B is partially cut alone line-b, line-c and line-d. By cutting the transmission line B partially along line-b, line-c and line-d, an inductor type of circuit is formed. The inductance of the oscillator is increased. Consequently, the frequency of the oscillator is decreased because the increase of the inductance. In an exemplary circuit, by partially cutting the transmission line-B alone line-b, line-c, and line-d, an oscillator of 2.0 GHz has a frequency reduced by approximately 40 MHz.

According to FIG. 6 and above description, this invention discloses an electronic device formed by interconnecting a plurality of circuit elements. The electronic device includes a first patterned conductive layer 201 constituting micro-strips for interconnecting the plurality of circuit elements. And, one of the micro-strips, e.g., transmission line B, constituting a capacitor-connection line for interconnecting two capacitors C5 and C3, wherein the capacitor connection line B is cut partially for providing a coupling inductance serially connected to the capacitors.

Therefore, this invention discloses a novel frequency tuning configuration for manufacturing a voltage control oscillator with reduced size and simplified manufacturing such that the limitations and difficulties encountered in the prior art are overcome. Specifically, a novel configuration for manufacturing and assembling an electronic device is disclosed by overlapping multiple layers of conductive foils with insulation layer provided with through holes filled with conductive materials to interconnect circuits distributed over several layers. The frequency fining tuning is achieved by cutting open conductive segments to function as capacitors or by partially cutting a conductive strips to function as inductors thus increasing or decreasing the frequency. A novel configuration and assembling process is disclosed for interconnecting circuit elements disposed in a multi-layer assembly connected with patterned conductive foils as micro-strips. The size, height and weight of the electronic assembly are reduced and cost savings are achieved with simplified manufacturing processes. The processes for fine tuning the performance characteristics are simplified by making minor variation to the size and shapes of the micro strips. The variations may include cutting transmission lines into separate segments to decrease the capacitance of cutting partially into the transmission lines to increase the inductance.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A method for making an electronic device by interconnecting a plurality of circuit elements comprising steps of:
    patterning a first conductive layer to form micro-strips for interconnecting said plurality of circuit elements;
    cutting one of said micro-strips as an open-transmission line having a first end connected to a first capacitor on said conductive layer and a second end as an open-end, into separate segments for forming a new capacitor with said separate segments wherein said new capacitor is in series connection with said first capacitor for providing a reduced combined capacitance;
    interconnecting a resistor to a transistor by one of said micro-strips of said first patterned conductive layer;
    placing a first insulation layer underneath said first patterned conductive layer and placing a second patterned conductive layer underneath said first insulation layer and connecting said second patterned conductive layer to a ground voltage;
    placing a second insulation layer underneath said second patterned conductive layer and placing a third patterned conductive layer underneath said second insulation layer and making said third patterned conductive layer for providing an inductive function; and
    opening through holes in said first and second insulation layers and filling said through holes with conductive filling-material for interconnecting said circuit elements disposed on said first patterned conductive layer to said third patterned conductive layer.

2. A method for making an electronic device by interconnecting a plurality of circuit elements comprising steps of:
    forming a first patterned conductive layer to provide a plurality of micro-strips for interconnecting said plurality of circuit elements; and
    cutting one of said micro-strips which being formed as an open-transmission line having a first end connected to a first capacitor and a second end as an open-end, into separate segments for forming a new capacitor with said separate segments wherein said new capacitor is in series connection with said first capacitor for providing a reduced combined capacitance.

3. The method of making an electronic device of claim 2 further comprising a step of:
    interconnecting a resistor to a transistor by one of said micro-strips disposed on said first patterned conductive layer.

4. A method for making an electronic device by interconnecting a plurality of circuit elements comprising steps of:
    forming a first patterned conductive layer to provide a plurality of micro-strips for interconnecting said plurality of circuit elements; and
    forming an inductive circuit by partially cutting and patterning one of said micro-strips connected to a capacitor for forming a new coupled inductance-capacitance (LC) circuit to said electronic device.

5. The method of making an electronic device of claim 2 further comprising:
    placing a first insulation layer underneath said first patterned conductive layer and placing a second patterned conductive layer underneath said first insulation layer;

connecting said second patterned conductive layer to a ground voltage; and opening a first through hole in said first insulation layer and interconnecting a ground terminal on said first patterned conductive layer with said second patterned conductive layer with a first interlayer conductor passing through said hole opened in said first insulation layer.

6. The method of making an electronic device of claim 5 further comprising:

placing a second insulation layer underneath said second patterned conductive layer and placing a third patterned conductive layer underneath said second insulation layer; and opening a second through hole in said second insulation layer, a third through hole in said second patterned conductive layer and a fourth through hole in said first insulation layer and interconnecting said third conductive layer to said circuit elements disposed on said first patterned conductive layer with a second interlayer conductor passing through said second, third and fourth through holes.

7. A method for making an electronic device by interconnecting a plurality of circuit elements comprising steps of:

patterning a first conductive layer to form micro-strips for interconnecting said plurality of circuit elements;

forming a new inductor by cutting partially one of said micro-strips connected between two capacitors for forming a serially coupled inductance-capacitance (LC) circuit on said first patterned conductive layer;

interconnecting a resistor to a transistor by one of said micro-strips of said first patterned conductive layer;

placing a first insulation layer underneath said first patterned conductive layer and placing a second patterned conductive layer underneath said first insulation layer and connecting said second patterned conductive layer to a ground voltage;

placing a second insulation layer underneath said second patterned conductive layer and placing a third patterned conductive layer underneath said second insulation layer; and opening through holes in said first and said second insulation layer and interconnecting said circuit elements disposed on said first patterned conductive layer to said third patterned conductive layer with an interlayer conductor passing through said through holes.

8. A method for making an electronic device by interconnecting a plurality of circuit elements comprising steps of:

patterning a first conductive layer to form a plurality of micro-strips for interconnecting said plurality of circuit elements; and forming a new inductor by cutting partially one of said micro-strips connected between two capacitors for forming a serially coupled inductance-capacitance (LC) circuit on said first patterned conductive layer.

9. The method of making an electronic device of claim 8 further comprising:

interconnecting a resistor to a transistor by one of said micro-strips disposed on said first patterned conductive layer.

10. The method of making an electronic device of claim 8 further comprising:

cutting a second end of one of said micro-strips into separate segments for forming a second capacitor with said separate segments wherein a first end for one of said micro-strips connected to an first capacitor, whereby said second capacitor and said first capacitor are in series connection for providing a reduced combined capacitance.

11. The method of making an electronic device of claim 8 further comprising:

placing a first insulation layer underneath said first patterned conductive layer and placing a second patterned conductive layer underneath said first insulation layer;

connecting said second patterned conductive layer to a ground voltage; and opening a first through hole in said first insulation layer and interconnecting a ground terminal on said first patterned conductive layer with said second patterned conductive layer with a first interlayer conductor passing through said hole opened in said first insulation layer.

12. The method of making an electronic device of claim 11 further comprising:

placing a second insulation layer underneath said second patterned conductive layer and placing a third patterned conductive layer underneath said second insulation layer;

placing a third insulation layer underneath said third patterned conductive layer and then placing a fourth patterned conductive layer underneath said third insulation layer and connecting said fourth patterned conductive layer to a ground voltage; and opening through holes in said first, said second and said third insulation layer and interconnecting said third conductive layer to said circuit elements disposed on said first patterned conductive layer with a second interlayer connector pass through said through holes.

13. An electronic device formed by interconnecting a plurality of circuit elements comprising:

a first patterned conductive layer constituting micro-strips for interconnecting said plurality of circuit elements;

one of said micro-strips constituting an open-transmission line having a first end connected to a first capacitor and a second end as an open-end, wherein said open transmission line is cut into separate segments with said separate segments constituting a new capacitor in series connection with said first capacitor for providing a reduced combined capacitance on said first patterned conductive layer;

a resistor and a transistor interconnected by said micro-strips of said patterned conductive layer;

a second patterned conductive layer insulated from said first patterned conductive layer by a first insulation layer;

a third patterned conductive layer for providing a ground voltage disposed between and insulated from said first conductive and second conductive layers by a first and a second insulation layer; and said first and a second insulation layers includes through holes filled with conductive filling material for interconnecting said circuit elements disposed on said first patterned conductive layer, and said second patterned conductive layer.

14. An electronic device formed by interconnecting a plurality of circuit elements comprising:

a first patterned conductive layer constituting micro-strips for interconnecting said plurality of circuit elements; and one of said micro-strips constituting an open-transmission line having a first end connected to a first capacitor and a second end as an open-end cut into separate segments with said separate segments constituting a new capacitor in series connection with said first capacitor for providing a reduced combined capacitance.

15. The electronic device of claim 14 further comprising:
a resistor and a transistor interconnected by one of said micro-strips disposed on said first patterned conductive layer.

16. The electronic device of claim 14 further comprising:
an inductive circuit formed by partially cutting and patterning one of said micro-strips connected to a capacitor for providing a coupled inductance-capacitance (LC) circuit to said electronic device.

17. The electronic device of claim 14 further comprising:
a second patterned conductive layer insulated from said first patterned conductive layer by a first insulation layer; and
said first insulation layer includes through holes filled with conductive filling material for interconnecting said circuit elements disposed on said first patterned conductive layer and said second patterned conductive layer.

18. The electronic device of claim 17 further comprising:
a third patterned conductive layer for providing a ground voltage disposed under said first insulation layer insulated from said first conductive layer and above said second patterned conductive layer;
a second insulation layer disposed between said third patterned conductive layer and said second patterned conductive layer; and
said second insulation layer includes through holes filled with conductive filling material for interconnecting said circuit elements disposed on said first patterned conductive layer and said second patterned conductive layer.

19. The electronic device of claim 17 further comprising:
a third patterned conductive layer for providing a ground voltage disposed between and insulated from said first conductive and a second patterned conductive layers by a first insulation layer and a second insulation layer; and
said first and second insulation layers includes through holes filled with conductive filling material for interconnecting said circuit elements disposed on said first patterned conductive layer and said second patterned conductive layer.

20. An electronic device formed by interconnecting a plurality of circuit elements comprising:
a first patterned conductive layer constituting micro-strips for interconnecting said plurality of circuit elements;
one of said micro-strips connected between two capacitors is cut partially for providing a serially coupled inductance-capacitance (LC) circuit on said first patterned conductive layer;
a resistor and a transistor interconnected by one of said micro-strips of said first patterned conductive layer;
a second patterned conductive layer insulated from said first patterned conductive layer by a first insulation layer;
said first insulation layer includes through holes filled with conductive filling material for interconnecting said circuit elements disposed on said first patterned conductive layer and said second patterned conductive layer;
a third patterned conductive layer for providing a ground voltage disposed between and insulated from said first conductive and second conductive layers by said first insulation layer and a second insulation layer; and
said first and second insulation layers include through holes filled with conductive filing material for interconnecting said circuit elements disposed on said first patterned conductive layer and said second conductive layer.

21. An electronic device formed by interconnecting a plurality of circuit elements comprising:
a first patterned conductive layer constituting micro-strips for interconnecting said plurality of circuit elements; and
one of said micro-strips connected between two capacitors is cut partially for providing serially coupled inductance-capacitance (LC) circuit on said first patterned conductive layer.

22. The electronic device of claim 21 further comprising:
a resistor and a transistor interconnected by one of said micro-strips on said first patterned conductive layer.

23. The electronic device of claim 21 further comprising:
a second patterned conductive layer insulated from said first patterned conductive layer by a first insulation layer; and
said first insulation layer includes through holes filled with conductive filling material for interconnecting said circuit elements disposed on said first patterned conductive layer and said second patterned conductive layer.

24. The electronic device of claim 23 further comprising:
a third patterned conductive layer for providing a ground voltage disposed below said first insulation layer and insulated from said first patterned conductive layer; and
a second insulation layer for insulating said second and third patterned conductive layers having through holes filled with conductive filling material for interconnecting said first patterned conductive layer to said second patterned conductive layer.

25. An electronic device formed by interconnecting a plurality of circuit elements comprising:
a plurality of patterned conductive layers constituting micro-strips for interconnecting said plurality of circuit elements disposed on each of said patterned conductive layers; and
one of said micro-sips constituting an open-transmission line having a first end connected to a first capacitor and a second end as an open-end cut into separate segments with said separate segments constituting a new capacitor in series connection with said first capacitor for providing a reduced combined capacitance;
a plurality of insulation layer disposed between said patterned conductive layers; and
each of said insulation layers includes through holes filled with conductive filling material for interconnecting said circuit elements disposed on said plurality of patterned conductive layers.

26. The electronic device of claim 25 wherein:
said first capacitor connected to said separated segments is further serially, connected to an inductance circuit constituting a coupled inductance-capacitance LC circuit.

27. The electronic device of claim 25 wherein:
one of said micro-strips connected between two capacitors is cut partially for providing a serially coupled inductance-capacitance (LC) circuit to said electronic device.

* * * * *

(12) EX PARTE REEXAMINATION CERTIFICATE (5073rd)
United States Patent
Tsai

(10) Number: US 6,188,295 C1
(45) Certificate Issued: Mar. 1, 2005

(54) FREQUENCY ADJUSTMENTS BY PATTERNING MICRO-STRIPS TO FORM SERIALLY CONNECTED CAPACITORS OR INDUCTOR-CAPACITOR (LC) CIRCUIT

(75) Inventor: Yu-Yuan Tsai, Taoyuan (TW)

(73) Assignee: Delta Electronics, Inc., Taipei (TW)

Reexamination Request:
No. 90/006,452, Nov. 18, 2002

Reexamination Certificate for:
| | |
|---|---|
| Patent No.: | 6,188,295 |
| Issued: | Feb. 13, 2001 |
| Appl. No.: | 09/291,436 |
| Filed: | Apr. 13, 1999 |

(51) Int. Cl.$^7$ .............................................. H03B 5/18
(52) U.S. Cl. ................. 331/108 D; 331/96; 331/117 D; 331/177 V; 331/179
(58) Field of Search ..................... 331/108 D, 117 D, 331/177 V, 179

(56) References Cited

U.S. PATENT DOCUMENTS 5,532,651 A * 7/1996 Jager et al. ................... 331/96

FOREIGN PATENT DOCUMENTS

| EP | 0823777 A1 | 11/1998 |
|---|---|---|
| EP | 0823777 | * 11/1998 |

* cited by examiner

*Primary Examiner*—Arnold Kinkead

(57) ABSTRACT

The present invention discloses an electronic device formed by interconnecting a plurality of circuit elements. The electronic device includes a first patterned conductive layer constituting micro-strips for interconnecting the plurality of circuit elements. And, one of the micro-strips constituting an open-transmission line having a first end connected to a capacitor and a second end as an open-end, wherein the open transmission line is cut into separate segments for adjusting capacitance of the electronic device. In another preferred embodiment, this invention discloses an electronic device formed by interconnecting a plurality of circuit elements. The electronic device includes a first patterned conductive layer constituting micro-strips for interconnecting the plurality of circuit elements. And, one of the micro-strips constituting a capacitor-connection line for interconnecting two capacitors wherein the capacitor connection line is cut partially for providing a serially connected inductance coupling to the capacitors.

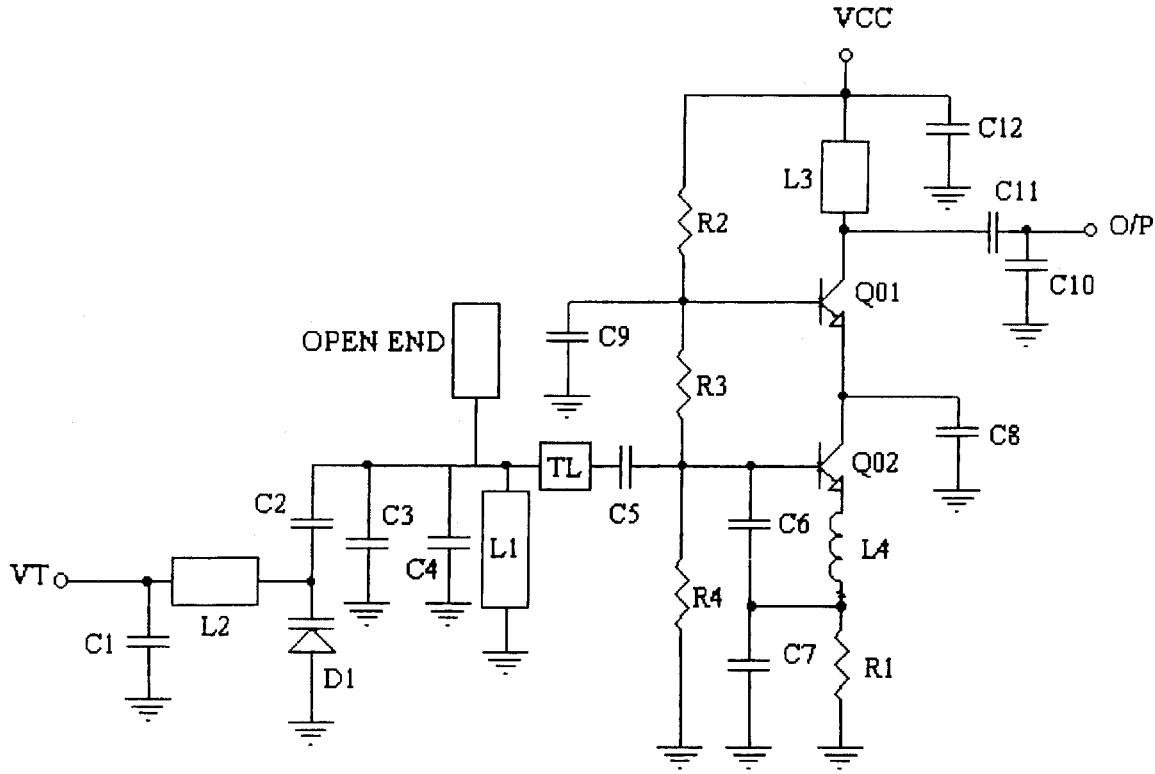

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–27 are cancelled.

\* \* \* \* \*